United States Patent
Makino et al.

(10) Patent No.: US 10,128,649 B2
(45) Date of Patent: Nov. 13, 2018

(54) POWER SUPPLY DEVICE

(71) Applicant: Mitsubishi Electric Corporation, Tokyo (JP)

(72) Inventors: Yasushi Makino, Tokyo (JP); Kenta Owada, Tokyo (JP)

(73) Assignee: Mistubishi Electric Corporation, Tokyo (JP)

( * ) Notice: Subject to any disclaimer, the term of this patent is extended or adjusted under 35 U.S.C. 154(b) by 0 days.

(21) Appl. No.: 15/535,474

(22) PCT Filed: Mar. 11, 2015

(86) PCT No.: PCT/JP2015/057198
§ 371 (c)(1),
(2) Date: Jun. 13, 2017

(87) PCT Pub. No.: WO2016/143102
PCT Pub. Date: Sep. 15, 2016

(65) Prior Publication Data
US 2017/0353028 A1    Dec. 7, 2017

(51) Int. Cl.
*H02H 7/125*    (2006.01)
*H02M 3/155*    (2006.01)
(Continued)

(52) U.S. Cl.
CPC ......... *H02H 7/125* (2013.01); *H01L 29/1608* (2013.01); *H02H 3/24* (2013.01);
(Continued)

(58) Field of Classification Search
CPC ............ H02H 7/125; H02H 7/12; H02H 9/02; H02H 9/04; H02H 9/00; H02H 9/025;
(Continued)

(56) References Cited

U.S. PATENT DOCUMENTS 6,969,976 B1 * 11/2005 Broach ................ H02M 3/156
323/222
2005/0017695 A1 * 1/2005 Stanley ............... H02M 1/4208
323/207
(Continued)

FOREIGN PATENT DOCUMENTS

CN    2857298 Y    1/2007
CN    203289118 U    11/2013
(Continued)

OTHER PUBLICATIONS

International Search Report of the International Searching Authority dated Jun. 2, 2015 for the corresponding international application No. PCT/JP2015/057198 (and English translation).
(Continued)

*Primary Examiner* — Gustavo Rosario Benitez
(74) *Attorney, Agent, or Firm* — Posz Law Group, PLC

(57) ABSTRACT

A power supply device includes a resistor that limits an electric current supplied from an AC power supply, a switching unit that is connected in parallel with the resistor, a rectifier circuit unit that is connected to a subsequent stage of the resistor and the switching unit and rectifies an AC voltage of the AC power supply, a booster circuit unit, a DC-voltage detection unit that detects a DC voltage output from the booster circuit unit, an AC voltage detection unit, a protection setting unit that compares a first protection voltage calculated on the basis of the boosting level by the booster circuit unit with a second protection voltage calculated based on the AC voltage detected by the AC-voltage detection unit and sets either one as a protection voltage, and a control unit that opens the switching unit when the DC voltage falls below the protection voltage and stops boosting.

8 Claims, 8 Drawing Sheets

(51) Int. Cl.
*H02M 7/217* (2006.01)
*H01L 29/16* (2006.01)
*H01L 29/20* (2006.01)
*H02M 7/06* (2006.01)
*H02M 1/42* (2007.01)
*H02H 9/00* (2006.01)
*H02H 3/24* (2006.01)
*H02M 1/00* (2006.01)

(52) U.S. Cl.
CPC .......... *H02H 9/001* (2013.01); *H02M 1/4225* (2013.01); *H02M 3/155* (2013.01); *H02M 7/06* (2013.01); *H02M 7/217* (2013.01); *H01L 29/1602* (2013.01); *H01L 29/2003* (2013.01); *H02M 2001/0025* (2013.01); *Y02B 70/126* (2013.01)

(58) Field of Classification Search
CPC ........... H02H 3/08; H02H 3/087; H02M 1/32; H02M 3/155; H02M 7/217; H02M 1/36; H02M 7/48; H02M 7/06; H02M 7/04; H02M 7/537; H02M 7/125; H02M 2001/0025; H01L 29/1602; H01L 29/1608; H01L 29/2003
See application file for complete search history.

(56) References Cited

U.S. PATENT DOCUMENTS

| | | | |
|---|---|---|---|
| 2006/0022648 A1 | 2/2006 | Ben-Yaakov et al. | |
| 2006/0132105 A1* | 6/2006 | Prasad | H02M 1/4225 323/222 |
| 2007/0047100 A1 | 3/2007 | Takahashi | |
| 2007/0156258 A1* | 7/2007 | Briskin | H02H 9/025 700/40 |
| 2008/0150369 A1* | 6/2008 | Suzuki | H02H 9/001 307/99 |
| 2012/0106212 A1 | 5/2012 | Momose et al. | |
| 2012/0212201 A1* | 8/2012 | Lee | H02M 3/073 323/282 |
| 2012/0257310 A1* | 10/2012 | Wang | H02H 3/382 361/18 |
| 2013/0100713 A1* | 4/2013 | Wei | H02M 1/36 363/21.12 |
| 2013/0308360 A1* | 11/2013 | Koiwai | H02M 1/4225 363/89 |
| 2014/0119078 A1* | 5/2014 | Walters | H02M 1/4225 363/89 |
| 2015/0062986 A1* | 3/2015 | Park | H02M 1/4208 363/89 |

FOREIGN PATENT DOCUMENTS

| | | |
|---|---|---|
| JP | 05-022930 A | 1/1993 |
| JP | 05-070193 U | 9/1993 |
| JP | 05-316640 A | 11/1993 |
| JP | 2004-153890 A | 5/2004 |
| JP | 2007-068338 A | 3/2007 |
| JP | 2008-252966 A | 10/2008 |
| JP | 2010-011533 A | 1/2010 |
| JP | 2010-167012 A | 8/2010 |
| JP | 2011-087378 A | 4/2011 |
| JP | 2011-167012 A | 8/2011 |
| JP | 2012-095511 A | 5/2012 |
| JP | 2012-175882 A | 9/2012 |
| JP | 2012-235629 A | 11/2012 |

OTHER PUBLICATIONS

Extended European Search Report dated May 17, 2017 for the corresponding European application No. 15 864 317.1.
Office Action dated Dec. 18, 2017 issued in corresponding AU patent application No. 2015386126.
Office Action dated Mar. 27, 2018 issued in corresponding AU patent application No. 2015386126.

* cited by examiner

POWER SUPPLY DEVICE

CROSS REFERENCE TO RELATED APPLICATION

This application is a U.S. national stage application of International Patent Application No. PCT/JP2015/057198 filed on Mar. 11, 2015, the disclosure of which is incorporated herein by reference.

TECHNICAL FIELD

The present invention relates to a power supply device that converts an AC voltage to a DC voltage.

BACKGROUND

When the power is turned on for a power supply device, there may be an inrush current that flows in the power supply device when a smoothing capacitor is charged. To prevent the inrush current from damaging an element, the power supply device adopts a configuration in which a resistor is connected in series with the smoothing capacitor, thereby suppressing the inrush current when the power is turned on.

In Patent Literature 1, such a power supply device is disclosed in which a relay is connected across an overcurrent protection circuit that includes an inrush-current suppressing resistor. When the power is turned on, the relay is opened and the charging current of the smoothing capacitor is consumed as heat by the inrush current limit resistor, thereby suppressing the inrush current when the power is turned on. Upon completion of charging the smoothing capacitor, the power supply device disclosed in Patent Literature 1 closes the relay and isolates the inrush-current suppressing resistor, thereby causing the current to flow to the relay without bypassing the inrush-current suppressing resistor.

Patent Literature 2 discloses a power supply device in which, when a momentary cutoff of the power supply occurs due to an instantaneous power failure, the voltage across the smoothing capacitor is compared with a set protection voltage, and the relay connected in parallel with the inrush-current limiting resistor is controlled on the basis of the comparison result, thereby suppressing the inrush current.

PATENT LITERATURE

Patent Literature 1: Japanese Patent Application Laid-open No. 2008-252966

Patent Literature 2: Japanese Patent Application Laid-open No. H5-316640

In the power supply devices according to Patent Literature 1 and Patent Literature 2, when the voltage across the smoothing capacitor falls below the set protection voltage, the operation of the power supply device is stopped and the relay is changed to an open state, thereby suppressing the inrush current flowing to the smoothing capacitor at the time of recovery from an instantaneous power failure.

In the power supply devices according to Patent Literature 1 and Patent Literature 2, if a momentary cutoff of the power supply occurs due to an instantaneous power failure, and the voltage across the smoothing capacitor does not fall below the protection voltage and the momentary cutoff is recovered, the relay is not changed to an open state and remains in a short-circuit state. Therefore, the inrush current does not flow in the inrush-current suppressing resistor but flows into the smoothing capacitor via the relay, thereby causing a problem in that the inrush current cannot be suppressed.

Furthermore, the magnitude of the inrush current occurring at the time of recovery from an instantaneous power failure depends on the difference between the voltage across the smoothing capacitor immediately before the recovery from the instantaneous power failure and the AC voltage at the time of recovery from the instantaneous power failure. Therefore, to suppress the inrush current within a protection voltage set range, the power supply device in Patent Literature 2 needs to be configured from an expensive element that has high current durability and is capable of enduring the inrush current.

SUMMARY

The present invention has been achieved in view of the above problems, and an object of the present invention is to provide a power supply device that can suppress an inrush current generated at the time of recovery from a power failure, without using an element that has high current durability and is capable of enduring the inrush current and without being affected by an operating state of a booster circuit unit and fluctuations in an AC voltage.

In order to solve the above problems and achieve the object, a power supply device according to an aspect of the present invention includes: a resistor that limits an electric current supplied from an alternating-current power supply; a switching unit that is connected in parallel with the resistor; a rectifier circuit unit that is connected to a subsequent stage of the resistor and the switching unit and rectifies an alternating-current voltage of the alternating-current power supply; a booster circuit unit that boosts a direct-current voltage rectified by the rectifier circuit unit; a direct-current-voltage detection unit that detects a direct-current voltage output from the booster circuit unit; an alternating-current-voltage detection unit that detects an alternating-current voltage of the alternating-current power supply; a protection setting unit that calculates a first protection voltage on a basis of a boosting level by the booster circuit unit, calculates a second protection voltage on a basis of the alternating-current voltage detected by the alternating-current-voltage detection unit, compares the first protection voltage with the second protection voltage, and sets either one of the first protection voltage and the second protection voltage as a protection voltage; and a control unit that opens the switching unit when the direct-current voltage falls below the protection voltage set by the protection setting unit and stops boosting performed by the booster circuit unit. The protection setting unit sets the second protection voltage as the protection voltage when the control unit stops boosting performed by the booster circuit unit.

ADVANTAGEOUS EFFECTS OF INVENTION

According to the present invention, it is possible to suppress an inrush current generated at the time of recovery from a power failure without being affected by the operating state of a booster circuit unit and fluctuations in an AC voltage.

DETAILED DESCRIPTION

A power supply device according to embodiments of the present invention will be explained below in detail with reference to the accompanying drawings. The present invention is not limited to the embodiments.

Embodiment

Figure 1:
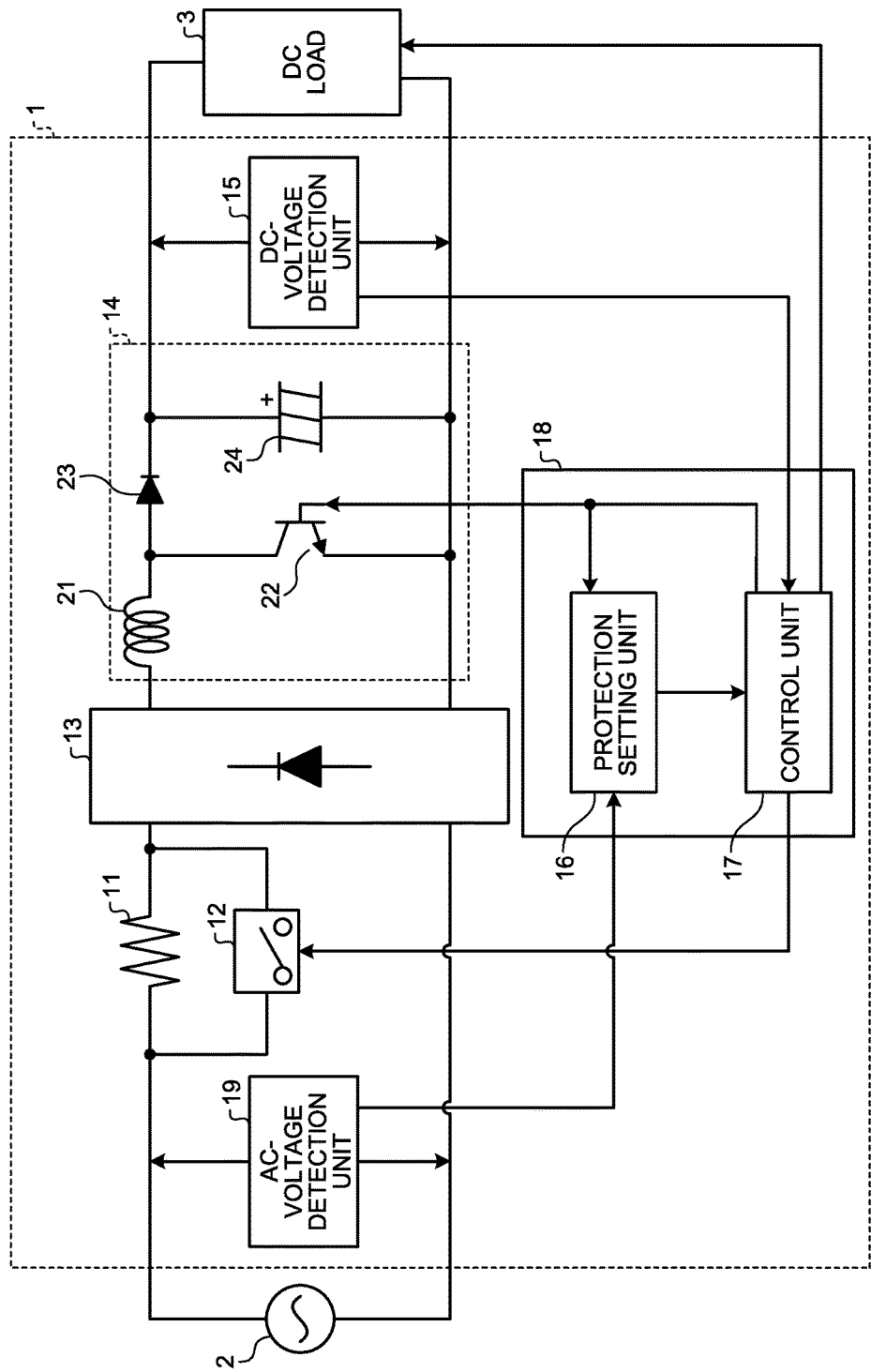
FIG. 1 is a configuration diagram of a power supply device according to an embodiment.
Figure 2:
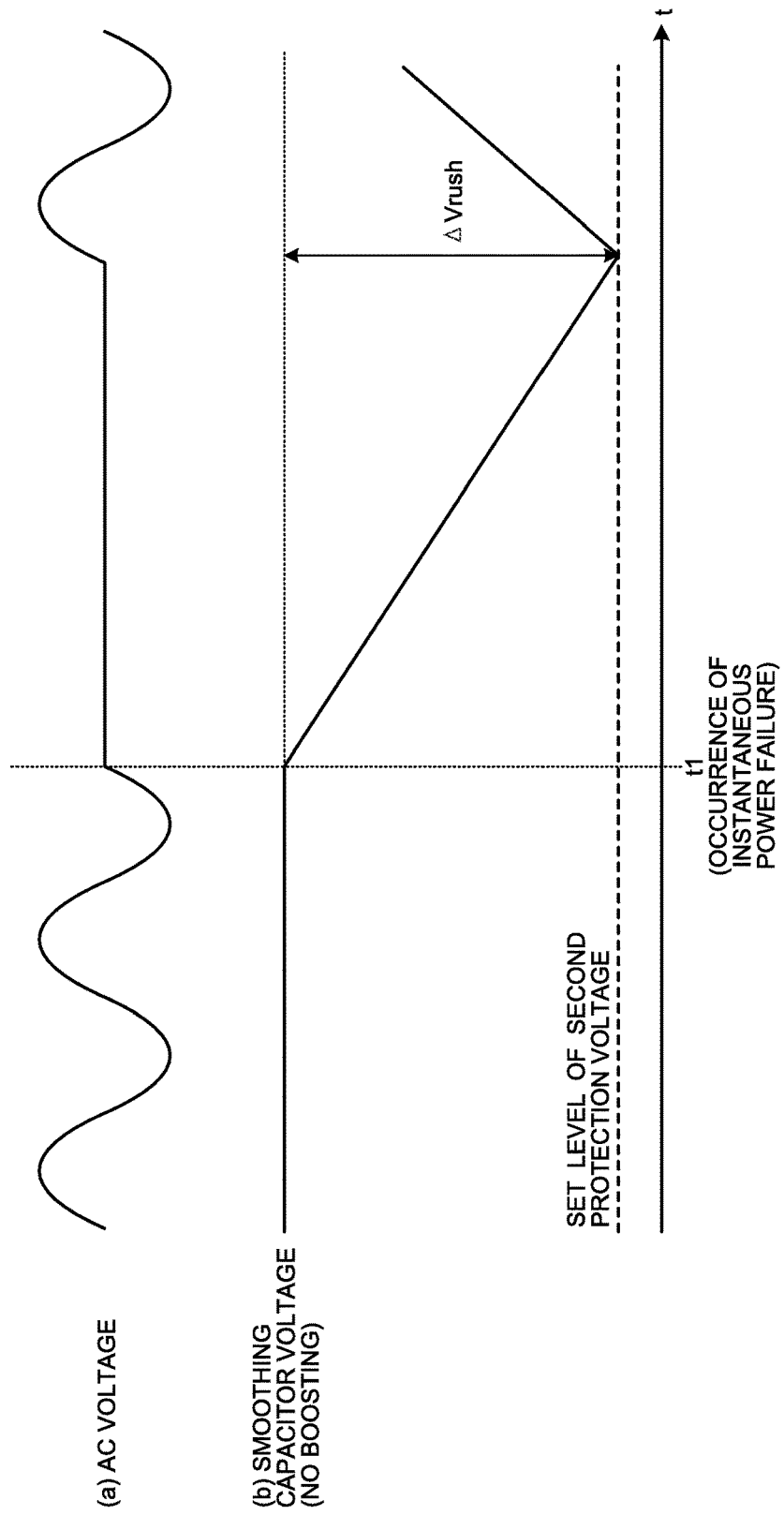
FIG. 2 is a diagram illustrating a relation between a set level of a second protection voltage and a limit value with respect to an inrush current of a semiconductor element constituting a booster circuit unit.
Figure 3:
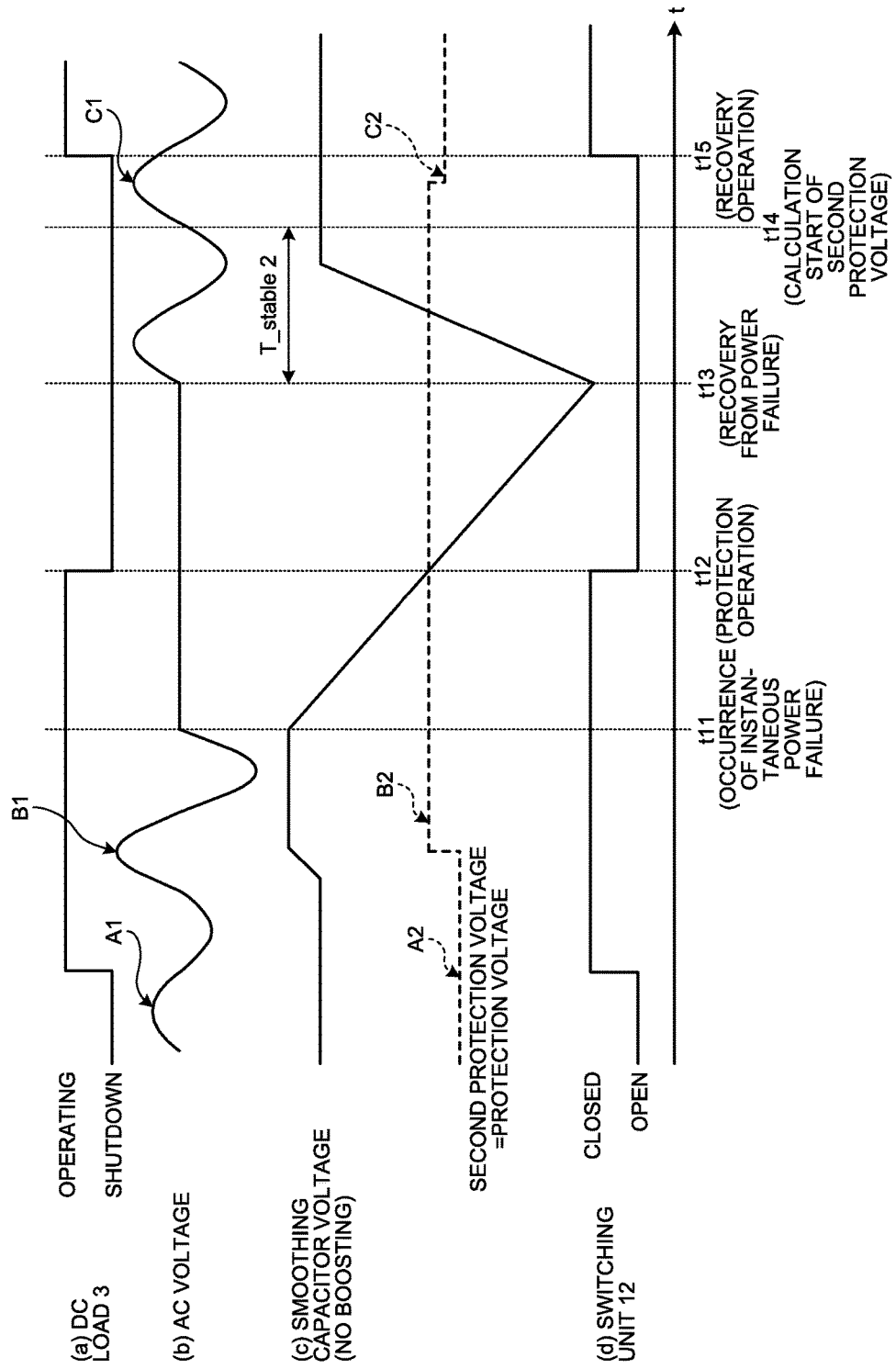
FIG. 3 is a diagram illustrating, in a case when a booster circuit unit has stopped, an operation of a power supply device from when an instantaneous power failure occurs to when an AC power supply is recovered.
Figure 4:
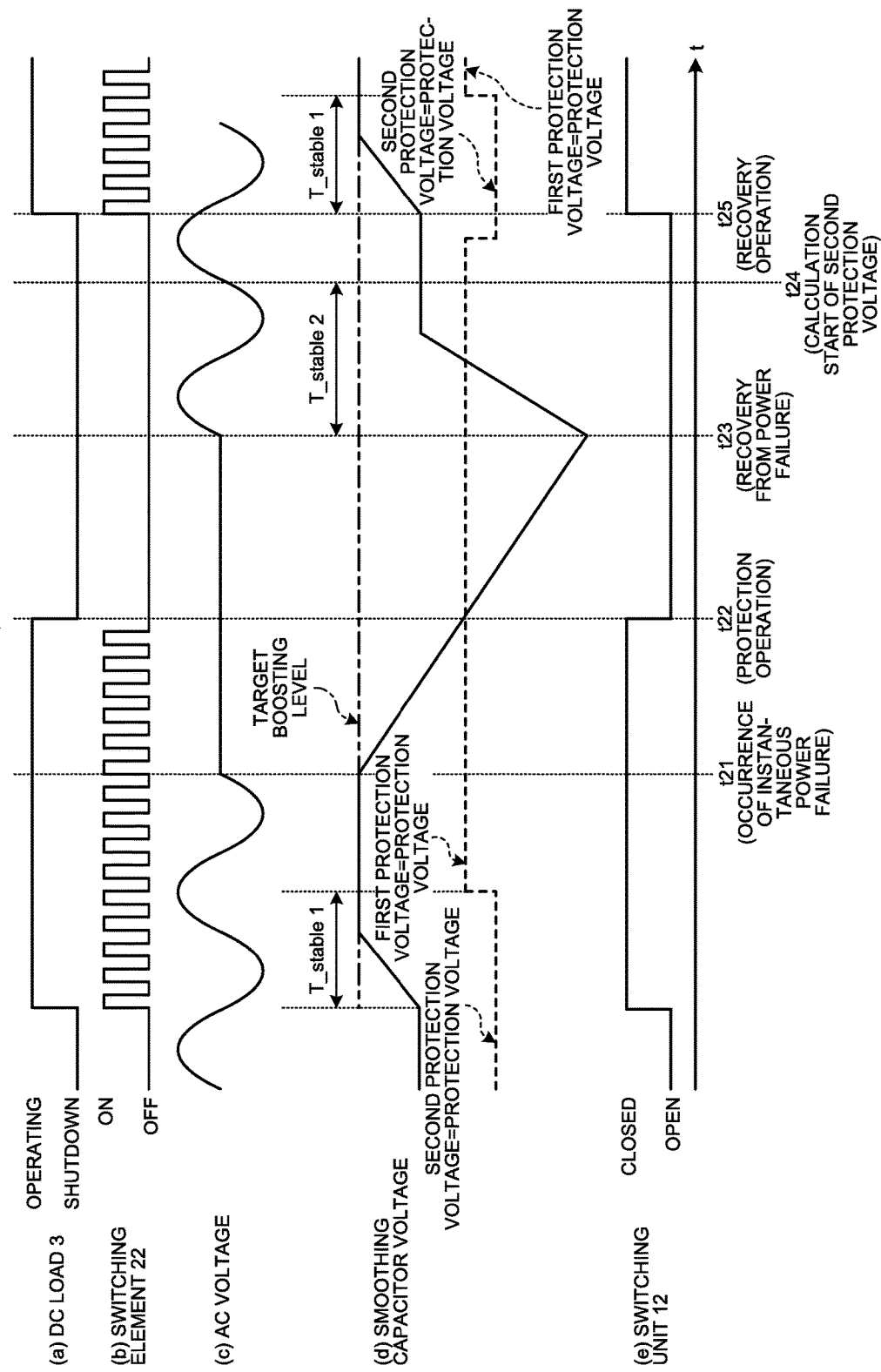
FIG. 4 is a diagram illustrating, in a case when a booster circuit unit is operating, an operation of a power supply device from when an instantaneous power failure occurs to when an AC power supply is recovered when a first protection voltage is set as a protection voltage.
Figure 5:
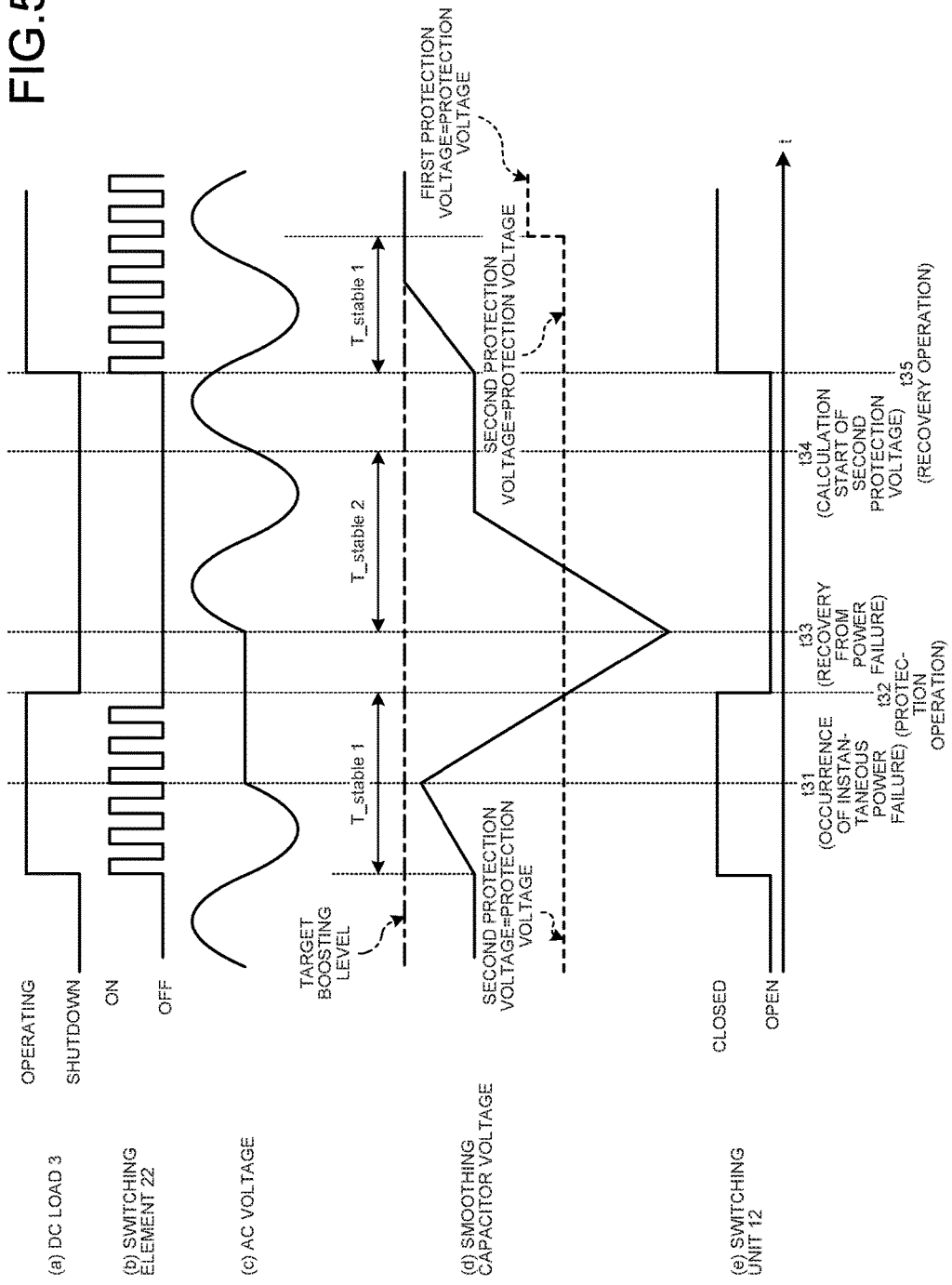
FIG. 5 is a diagram illustrating, in a case when a booster circuit unit is operating, an operation of a power supply device from when an instantaneous power failure occurs to when an AC power supply is recovered during the passage of a first transition period.
Figure 6:
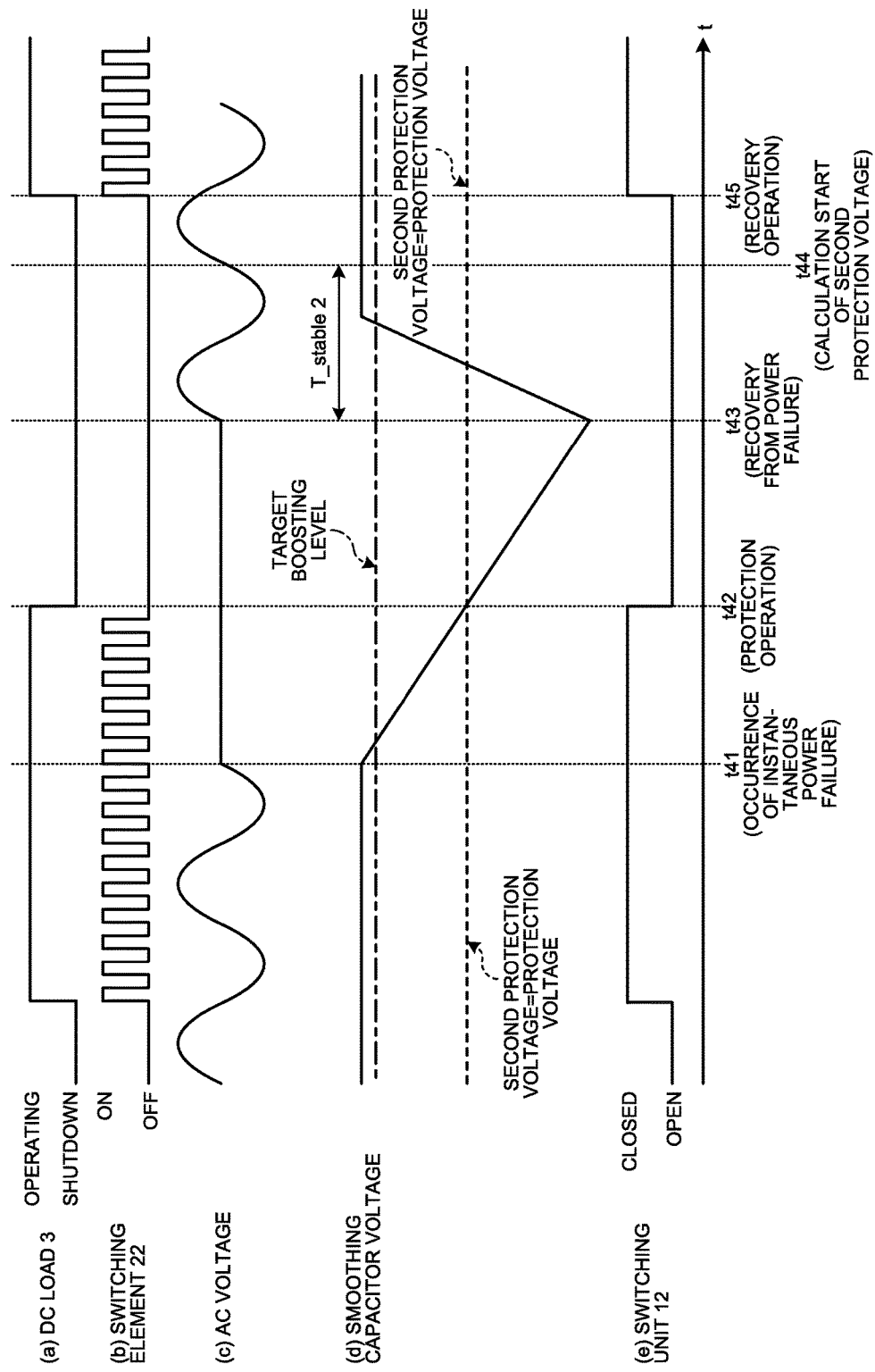
FIG. 6 is a diagram illustrating, in a case when a booster circuit unit is operating, an operation of a power supply device from when an instantaneous power failure occurs to when an AC power supply is recovered when a second protection voltage is set as a protection voltage.
Figure 7:
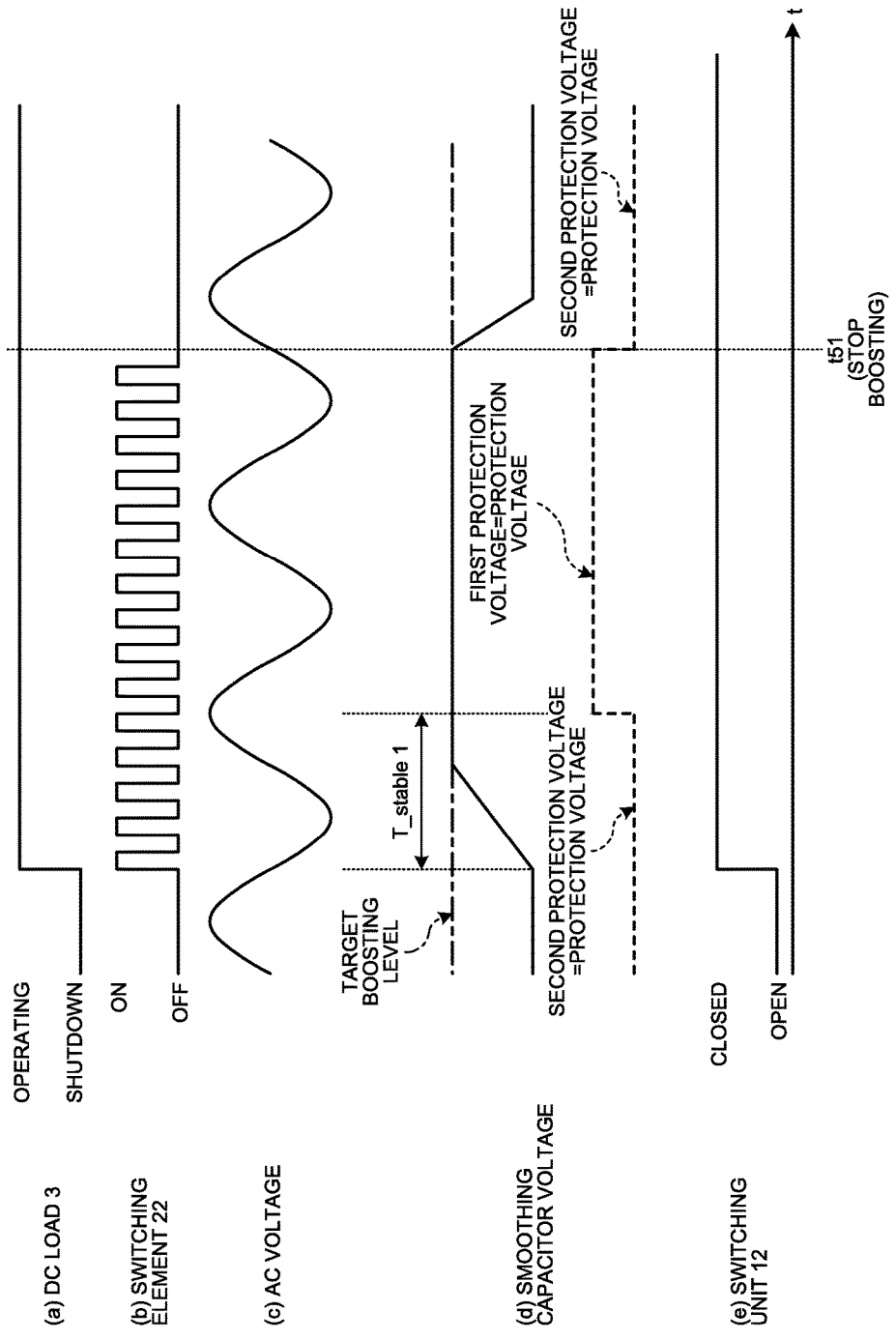
FIG. 7 is a diagram illustrating an operation of a power supply device when setting a protection voltage in a case when a booster circuit unit is changed from an operating state to a shutdown state.
Figure 8:
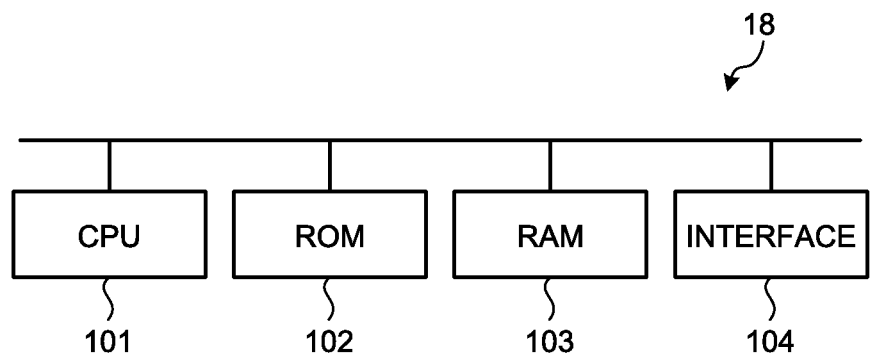
FIG. 8 is a block diagram illustrating a configuration of an operation control unit according to the embodiment.

FIG. 1 is a configuration diagram of a power supply device 1 according to an embodiment. FIG. 2 is a diagram illustrating a relation between a set level of a second protection voltage and a limit value with respect to an inrush current of a semiconductor element constituting a booster circuit unit. FIG. 3 is a diagram illustrating, in a case when a booster circuit unit has stopped, an operation of a power supply device from when an instantaneous power failure occurs to when an AC power supply is recovered. FIG. 4 is a diagram illustrating, in a case when a booster circuit unit is operating, an operation of a power supply device from when an instantaneous power failure occurs to when an AC power supply is recovered when a first protection voltage is set as a protection voltage. FIG. 5 is a diagram illustrating, in a case when a booster circuit unit is operating, an operation of a power supply device from when an instantaneous power failure occurs to when an AC power supply is recovered during the passage of a first transition period. FIG. 6 is a diagram illustrating, in a case when a booster circuit unit is operating, an operation of a power supply device from when an instantaneous power failure occurs to when an AC power supply is recovered when a second protection voltage is set as a protection voltage. FIG. 7 is a diagram illustrating an operation of a power supply device when setting a protection voltage in a case when a booster circuit unit is changed from an operating state to a shutdown state. FIG. 8 is a block diagram illustrating a configuration of an operation control unit 18 according to the embodiment.

The power supply device 1 is connected to a DC load 3 and an AC power supply 2, which is an external power supply. The power supply device 1 converts an AC voltage supplied from the AC power supply 2 to a DC voltage and supplies the converted DC voltage to the DC load 3.

The power supply device 1 includes a resistor 11 that limits an electric current; a switching unit 12 that switches between open and closed; a rectifier circuit unit 13 that rectifies an AC voltage; a booster circuit unit 14 that boosts a DC voltage; a DC-voltage detection unit 15 that detects a DC voltage; a protection setting unit 16 that sets a protection voltage; a control unit 17 that controls the switching unit 12 and the booster circuit unit 14; and an AC-voltage detection unit 19 that detects the AC voltage. The protection setting unit 16 and the control unit 17 constitute the operation control unit 18.

The resistor 11 limits an inrush current supplied from the AC power supply 2 at the time of recovery from a power failure. The switching unit 12 is configured from a relay and is connected in parallel with the resistor 11. The switching unit 12 can be configured not from a relay, but from an IGBT (Insulated Gate Bipolar Transistor) or a MOSFET (Metal-Oxide-Semiconductor Field-Effect Transistor). When the switch of the switching unit 12 is open, a current supplied from the AC power supply 2 passes through the resistor 11 and is supplied to the rectifier circuit unit 13. When the switching unit 12 is closed, a current supplied from the AC power supply 2 passes through the switching unit 12 and is supplied to the rectifier circuit unit 13.

The rectifier circuit unit 13 is connected to a subsequent stage of the resistor 11 and the switching unit 12 and rectifies the AC voltage.

The booster circuit unit 14 is also referred to as a "boost chopper circuit unit" and boosts the DC voltage rectified by the rectifier circuit unit 13 up to a set voltage. The configuration of the booster circuit unit 14 is described here.

The booster circuit unit 14 includes a boosting reactor 21, a switching element 22 that performs switching, a diode 23 that prevents backflow, and a smoothing capacitor 24 that smoothes the voltage rectified by the rectifier circuit unit 13. An IGBT or a MOSFET is exemplified as the switching element 22.

The reactor 21 and the diode 23 are connected in series between the high voltage side of the rectifier circuit unit 13 and the smoothing capacitor 24. The anode of the diode 23 is connected to the reactor 21 and the cathode of the diode 23 is connected to the DC load 3. The switching element 22 is connected between the reactor 21 and the diode 23 and on the wire that connects the high voltage side and the low voltage side.

When the switching element 22 is in an on-state, the booster circuit unit 14 accumulates energy in the reactor 21, and when the switching element 22 is in an off-state, the booster circuit unit 14 charges the smoothing capacitor 24 by using a back electromotive force generated in the reactor 21. The booster circuit unit 14 repeatedly switches the switching element 22 between an on-state and an off-state every set cycle to perform a boosting operation. The set cycle is a cycle with which a boosting operation can be performed. The switching element 22 and the diode 23, which are semiconductor elements constituting the booster circuit unit, can be wide bandgap semiconductors. The wide bandgap semiconductor can be SiC, GaN, or diamond. The booster circuit unit 14 is not limited to having the above configuration, and can have any configuration that can rectify the AC power supply and boost the voltage to an arbitrary DC voltage. The smoothing capacitor 24 repeats charging and discharging to smooth the voltage.

When boosting is not performed, the booster circuit unit 14 operates as a passive converter by setting the switching element 22 to always be in an off-state, and smoothes the voltage rectified by the rectifier circuit unit 13 without boosting the voltage to supply the voltage to the DC load 3.

The DC-voltage detection unit 15 detects the smoothing capacitor voltage that is a DC voltage output from the booster circuit unit 14. Specifically, the DC-voltage detection unit 15 detects the smoothing capacitor voltage that is the voltage across the smoothing capacitor 24. The smoothing capacitor voltage is equal to the DC bus voltage.

The protection setting unit 16 always acquires a control signal that is output from the control unit 17 to the booster circuit unit 14, and ascertains a boosting level, which indicates an operating state of the booster circuit unit 14, and a shutdown state thereof on the basis of the control signal. The protection setting unit 16 calculates the first protection voltage on the basis of the boosting level by the booster circuit unit 14 and calculates the second protection voltage on the basis of the AC voltage detected by the AC-voltage detection unit 19 to compare the first protection voltage with the second protection voltage and set either one as a protection voltage. Such a configuration is also possible in which the first protection voltage is newly calculated on the basis of a boosting level L1 updated at an arbitrary timing by the control unit 17, and the new first protection voltage is compared with the second protection voltage to set either one as the protection voltage.

The control unit 17 compares the smoothing capacitor voltage detected by the DC-voltage detection unit 15 with the protection voltage set by the protection setting unit 16. On the basis of the comparison result, the control unit 17 causes the booster circuit unit 14 to stop or perform boosting, causes the switching unit 12 to open or close the switch, and stops or starts the operation of the DC load 3. Specifically, when the smoothing capacitor voltage falls below the protection voltage, the control unit 17 causes the switching unit 12 to open the switch, causes the booster circuit unit 14 to stop boosting, and stops the operation of the DC load 3.

An explanation will be given of a specific operation of the control unit 17 and the protection setting unit 16 when boosting by the booster circuit unit 14 is stopped and a specific operation of the control unit 17 and the protection setting unit 16 when boosting is being performed by the booster circuit unit 14 with reference to FIGS. 2 to 7.

(When Boosting by the Booster Circuit Unit 14 is Stopped)

A case where boosting by the booster circuit unit 14 is stopped is described with reference to FIGS. 2 and 3. (a) in FIG. 2 illustrates a waveform of an AC voltage supplied from the AC power supply 2. (b) in FIG. 2 illustrates a waveform of a smoothing capacitor voltage detected by the DC-voltage detection unit 15. A case where an instantaneous power failure occurs at t1 in FIG. 2 is assumed here. The protection setting unit 16 calculates the second protection voltage on the basis of the AC voltage detected by the AC-voltage detection unit 19. The protection setting unit 16 sets the protection voltage such that it does not fall below a set lower limit. Specifically, under the condition of "Vdc_Under≤second protection voltage", the protection setting unit 16 calculates the second protection voltage according to equation (1) where Vdc_Under indicates the lower limit of the DC bus voltage that guarantees the product and ΔVrush indicates a limit value with respect to an inrush current of the semiconductor element constituting the booster circuit unit 14. As illustrated in FIG. 2, ΔVrush is a value when an instantaneous power failure occurs and the smoothing capacitor voltage decreases to a set level of the second protection voltage.

$$\text{Second protection voltage} = \text{AC voltage} \times \sqrt{2} - \Delta Vrush \qquad (1)$$

In the case of "Vdc_Under>second protection voltage", the protection setting unit 16 sets the second protection voltage to Vdc_Under. The protection setting unit 16 only needs to calculate the second protection voltage such that it is within ΔVrush, which is the limit value with respect to the inrush current of the semiconductor element constituting the booster circuit unit 14, and does not necessarily have to set the lower limit when there is no Vdc_Under.

The protection setting unit 16 calculates the first protection voltage on the basis of the boosting level by the booster circuit unit 14. When boosting by the booster circuit unit 14 stops, the protection setting unit 16 does not make a comparison between the first protection voltage and the second protection voltage and sets the second protection voltage as the protection voltage.

An operation of the protection setting unit 16 is described next with reference to FIG. 3. (a) in FIG. 3 illustrates an operating state or a shutdown state of the DC load 3. (b) in FIG. 3 illustrates a waveform of an AC voltage supplied from the AC power supply 2. (c) in FIG. 3 illustrates a waveform of a smoothing capacitor voltage detected by the DC-voltage detection unit 15. (d) in FIG. 3 illustrates the switch of the switching unit 12 being open or closed. In a period during which there is no occurrence of an instantaneous power failure, the protection setting unit 16 calculates the second protection voltage every predetermined time according to the equation (1) on the basis of the AC voltage detected by the AC-voltage detection unit 19 to update the protection voltage with the calculated second protection voltage. In FIG. 3, a case where the protection voltage is updated every power supply cycle is illustrated. The protection setting unit 16 calculates a second protection voltage A2 on the basis of the AC voltage at a point A1 illustrated in (b) in FIG. 3, and sets the second protection voltage A2 as the protection voltage. The protection setting unit 16 also calculates a second protection voltage B2 on the basis of the AC voltage at a point B1 illustrated in (b) in FIG. 3, and sets the second protection voltage B2 as the protection voltage. In an example illustrated in FIG. 3, because the AC power supply 2 fluctuates such that A1 is smaller than B1, the second protection voltage A2 is smaller than the second protection voltage B2. However, when the AC power supply 2 fluctuates such that A1 is larger than B1, the second protection voltage A2 is larger than the second protection voltage B2.

It is described above that the protection voltage is updated every power supply cycle. However, the protection voltage can be updated at set time intervals. By updating the protection voltage at set time intervals, even if the AC voltage of the AC power supply 2 fluctuates, the protection setting unit 16 can set the protection voltage corresponding to the fluctuated AC voltage. By providing Vdc_Under, the protection setting unit 16 can protect the DC load 3 at the time of operating beyond the product warranty.

An operation of the power supply device 1 when an instantaneous power failure occurs is described with reference to FIG. 3. Such a case is assumed here that an instantaneous power failure occurs at t11 in FIG. 3, a protection operation by the control unit 17 is started at t12 in FIG. 3, the power failure is recovered at t13 in FIG. 3, calculation of the second protection voltage is started at t14 in FIG. 3, and a recovery operation of the DC load 3 is performed at t15 in FIG. 3. When boosting is not performed, the booster circuit unit 14 operates as a passive converter by setting the switching element 22 to always be in an off-state.

Accordingly, the smoothing capacitor voltage detected by the DC-voltage detection unit 15 matches the peak value of the AC voltage supplied from the AC power supply 2.

When an instantaneous power failure occurs, as illustrated in (b) in FIG. 3, the AC power supply 2 stops supply of the AC voltage to the power supply device 1. The booster circuit unit 14 operates as a passive converter. Accordingly, as illustrated in (c) in FIG. 3, the smoothing capacitor voltage decreases. The protection setting unit 16 does not change the protection voltage. Specifically, as illustrated in (c) in FIG. 3, the protection setting unit 16 maintains the second protection voltage B2 set as the protection voltage without changing the second protection voltage B2.

At t12 in FIG. 3, when detecting that the smoothing capacitor voltage detected by the DC-voltage detection unit 15 has fallen below the protection voltage set by the protection setting unit 16, the control unit 17 starts the protection operation. Specifically, as illustrated in (a) in FIG. 3, the control unit 17 stops the operation of the DC load 3. Further, as illustrated in (d) in FIG. 3, the control unit 17 causes the switching unit 12 to open the switch. By causing the switching unit 12 to open the switch, the control unit 17 causes an inrush current flowing in the power supply device 1 at the time of recovery of the AC power supply 2 to flow into the resistor 11, thereby enabling the inrush current at the time of recovery from the power failure to be suppressed.

When the AC power supply 2 recovers from the instantaneous power failure, the protection setting unit 16 calculates the second protection voltage according to the equation (1) on the basis of the AC voltage detected by the AC-voltage detection unit 19, after passage of a second transition period that is a transition period of the smoothing capacitor voltage, and sets the calculated second protection voltage as the protection voltage. Hereinafter, the second transition period is referred to as "T_stable2".

T_stable2 is described here. The smoothing capacitor voltage increases up to a value of √2 times the AC voltage of the AC power supply 2. The value of √2 times the AC voltage is a peak value. Accordingly, the control unit 17 may detect that the smoothing capacitor voltage has fallen below the protection voltage before the smoothing capacitor voltage increases.

That is, in the power supply device 1, if the protection voltage is changed before the increase of the smoothing capacitor voltage reaches the peak value, the voltage state becomes "smoothing capacitor voltage protection voltage"; therefore, stop of boosting performed by the booster circuit unit 14 continues due to the protection operation by the control unit 17 and shutdown of the DC load 3 continues, thereby causing a startup failure.

Therefore, the protection setting unit 16 holds the setting of the protection voltage and inhibits the change of the setting until T_stable2 has passed even if the smoothing capacitor voltage has fallen below the protection voltage immediately after stop of supply of the AC voltage from the AC power supply 2 and recovery from the power failure has been detected by the AC voltage detected by the AC-voltage detection unit 19. After supply of the AC voltage from the AC power supply 2 is started and T_stable2 has passed, the protection setting unit 16 changes the setting of the protection voltage. Specifically, after T_stable2 has passed, the protection setting unit 16 calculates a second protection voltage C2 according to the equation (1) described above on the basis of the AC voltage at a point C1 illustrated in (b) in FIG. 3, and changes the setting of the protection voltage from the second protection voltage B2 to the second protection voltage C2. The control unit 17 continues the protection operation from when the protection operation is started at t12 in FIG. 3 to when T_stable2 has passed even if the smoothing capacitor voltage becomes higher than the protection voltage.

In the power supply device 1, the voltage state becomes "smoothing capacitor voltage>protection voltage" after T_stable2 has passed. Therefore, the control unit 17 does not perform the protection operation and thus the startup failure can be prevented.

(When the Booster Circuit Unit 14 Performs Boosting)

A case where the booster circuit unit 14 performs boosting is described with reference to FIG. 4 to FIG. 7. The protection setting unit 16 calculates the first protection voltage on the basis of the boosting level by the booster circuit unit 14 and calculates the second protection voltage on the basis of the AC voltage detected by the AC-voltage detection unit 19 to compare the first protection voltage with the second protection voltage. The protection setting unit 16 calculates the second protection voltage according to the equation (1) described above.

A setting procedure according to the protection voltage set by the protection setting unit 16 is described below. Specifically, in a case of "first protection voltage≥second protection voltage", the first protection voltage is set as the protection voltage. In a case of "first protection voltage<second protection voltage", the second protection voltage is set as the protection voltage. The case of "first protection voltage≥second protection voltage" and the case of "first protection voltage<second protection voltage" are separately described.

(Case of First Protection Voltage≥Second Protection Voltage)

After boosting is started by the booster circuit unit 14 and the first transition period that is a transition period of the smoothing capacitor voltage has passed, the protection setting unit 16 changes the setting of the protection voltage from the second protection voltage to the first protection voltage. Hereinafter, the first transition period is referred to as "T_stable1".

An operation of the power supply device 1 when an instantaneous power failure occurs is described with reference to FIG. 4. (a) in FIG. 4 illustrates an operating state or a shutdown state of the DC load 3. (b) in FIG. 4 illustrates an on-state or an off-state of the switching element 22. (c) in FIG. 4 illustrates a waveform of the AC voltage supplied from the AC power supply 2. (d) in FIG. 4 illustrates a waveform of the smoothing capacitor voltage detected by the DC-voltage detection unit 15. (e) in FIG. 4 illustrates the switch of the switching unit 12 being open or closed. Such a case is assumed here that an instantaneous power failure occurs at t21 in FIG. 4, a protection operation by the control unit 17 is started at t22 in FIG. 4, the power failure is recovered at t23 in FIG. 4, calculation of the second protection voltage is started at t24 in FIG. 4, and a recovery operation of the DC load 3 is performed at t25 in FIG. 4. The booster circuit unit 14 increases the smoothing capacitor voltage until the voltage reaches a target boosting level on the basis of the control by the control unit 17.

If the control unit 17 changes the setting of the protection voltage from the second protection voltage to the first protection voltage before the smoothing capacitor voltage reaches the target boosting level, the control unit 17 may detect that the smoothing capacitor voltage has fallen below the protection voltage.

That is, in the power supply device 1, if the protection voltage is changed before the smoothing capacitor voltage reaches the target boosting level, the voltage state becomes "smoothing capacitor voltage protection voltage"; therefore, the booster circuit unit 14 may stop boosting and the operation of the DC load 3 may stop due to the protection operation by the control unit 17.

Therefore, the protection setting unit 16 holds the setting of the protection voltage and inhibits the change of the setting until T_stable1 has passed after boosting by the booster circuit unit 14 is started, and changes the setting of the protection voltage from the second protection voltage to the first protection voltage after T_stable1 has passed.

When detecting that the smoothing capacitor voltage detected by the DC-voltage detection unit 15 has fallen below the protection voltage set by the protection setting unit 16, the control unit 17 starts the protection operation. Specifically, the control unit 17 causes the booster circuit unit 14 to stop boosting, stops the operation of the DC load 3, and causes the switching unit 12 to open the switch. By causing the switching unit 12 to open the switch, the control unit 17 causes an inrush current flowing in the power supply device 1 at the time of recovery of the AC power supply 2 to flow into the resistor 11, thereby enabling the inrush current at the time of recovery from the power failure to be suppressed. Further, the protection setting unit 16 does not change the setting of the protection voltage until the AC power supply 2 recovers from the instantaneous power failure.

When the AC power supply 2 recovers from the instantaneous power failure, because boosting by the booster circuit unit 14 has been stopped, the smoothing capacitor voltage does not reach the voltage exceeding the value of $\sqrt{2}$ times the AC voltage of the AC power supply 2. When the AC power supply 2 recovers from the instantaneous power failure, the protection setting unit 16 performs the same processing as that at the time of stopping boosting performed by the booster circuit unit 14. That is, when detecting recovery from the power failure by the AC voltage detected by the AC-voltage detection unit 19, the protection setting unit 16 holds the setting of the protection voltage and inhibits the change of the setting until T_stable2 has passed and changes the setting of the protection voltage after T_stable2 has passed. Specifically, after T_stable2 has passed, the protection setting unit 16 calculates the second protection voltage according to the equation (1) described above on the basis of the AC voltage detected by the AC-voltage detection unit 19, and changes the setting of the protection voltage to the calculated second protection voltage. The control unit 17 continues the protection operation from when the protection operation is started at t22 in FIG. 4 to when T_stable2 has passed even if the smoothing capacitor voltage becomes higher than the protection voltage.

An operation of the power supply device 1 when an instantaneous power failure occurs during T_stable1 is described with reference to FIG. 5. (a) in FIG. 5 illustrates an operating state or a shutdown state of the DC load 3. (b) in FIG. 5 illustrates an on-state or an off-state of the switching element 22. (c) in FIG. 5 illustrates a waveform of an AC voltage supplied from the AC power supply 2. (d) in FIG. 5 illustrates a waveform of a smoothing capacitor voltage detected by the DC-voltage detection unit 15. (e) in FIG. 5 illustrates the switch of the switching unit 12 being open or closed. Such a case is assumed here that an instantaneous power failure occurs at t31 in FIG. 5, the protection operation by the control unit 17 is started at t32 in FIG. 5, a power failure is recovered at t33 in FIG. 5, calculation of the second protection voltage is started at t34 in FIG. 5, and a recovery operation of the DC load 3 is performed at t35 in FIG. 5. If an instantaneous power failure occurs, as illustrated in (c) in FIG. 5, the AC power supply 2 stops supply of the AC voltage to the power supply device 1. Because there is no voltage to be boosted, the booster circuit unit 14 cannot perform boosting. Therefore, the smoothing capacitor voltage decreases, as illustrated in (d) in FIG. 5, due to the operation of the DC load 3.

When detecting that the smoothing capacitor voltage detected by the DC-voltage detection unit 15 has fallen below the protection voltage set by the protection setting unit 16, the control unit 17 starts the protection operation. Specifically, the control unit 17 causes the booster circuit unit 14 to stop boosting, stops the operation of the DC load 3, and causes the switching unit 12 to open the switch. By causing the switching unit 12 to open the switch, the control unit 17 causes an inrush current flowing in the power supply device 1 at the time of recovery of the AC power supply 2 to flow into the resistor 11, thereby enabling the inrush current at the time of recovery from the power failure to be suppressed. Further, the protection setting unit 16 does not change the setting of the protection voltage until the AC power supply 2 recovers from the instantaneous power failure.

When the AC power supply 2 recovers from the instantaneous power failure, because boosting by the booster circuit unit 14 has been stopped, the smoothing capacitor voltage does not reach the voltage exceeding the value of $\sqrt{2}$ times the AC voltage of the AC power supply 2. When the AC power supply 2 recovers from the instantaneous power failure, the protection setting unit 16 performs the same processing as that at the time of stopping boosting performed by the booster circuit unit 14. That is, when detecting recovery from the power failure by the AC voltage detected by the AC-voltage detection unit 19, the protection setting unit 16 holds the setting of the protection voltage and inhibits the change of the setting until T_stable2 has passed and changes the setting of the protection voltage after T_stable2 has passed. Specifically, after T_stable2 has passed, the protection setting unit 16 calculates the second protection voltage according to the equation (1) described above on the basis of the AC voltage detected by the AC-voltage detection unit 19, and changes the setting of the protection voltage to the calculated second protection voltage.

By setting T_stable1, the power supply device 1 can protect the DC load 3 even in a state where the smoothing capacitor voltage has not reached the target boosting level.

Setting of a protection voltage when the AC power supply 2 recovers from an instantaneous power failure is described next. It is assumed here that an instantaneous power failure occurs, the smoothing capacitor voltage falls below a protection voltage, and boosting by the booster circuit unit 14 and an operation of the DC load 3 are stopped due to a protection operation by the control unit 17. When the AC power supply 2 recovers from an instantaneous power failure, the protection setting unit 16 performs the same processing as that at the time of stopping boosting performed by the booster circuit unit 14. That is, when detecting recovery from the power failure by the AC voltage detected by the AC-voltage detection unit 19, the protection setting unit 16 holds the setting of the protection voltage and inhibits the change of the setting until T_stable2 has passed and changes the setting of the protection voltage after T_stable2 has passed. Specifically, after T_stable2 has passed, the protection setting unit 16 calculates the second protection voltage according to the equation (1) described above on the basis of the AC voltage detected by the AC-voltage detection unit 19, and changes the setting of the protection voltage to the calculated second protection voltage. It is assumed here that the second protection voltage has been set as the protection voltage by the protection setting unit 16. The second protection voltage is a protection voltage 1. Further, when the first protection voltage is compared with the second protection voltage by the protection setting unit 16, in the case of "first protection voltage<second protection voltage", the second protection voltage is a protection voltage 2.

(Case of "First Protection Voltage<Second Protection Voltage")

When boosting by the booster circuit unit 14 is started, the protection setting unit 16 does not count T_stable1, i.e., does not set T_stable1, and sets the second protection voltage as the protection voltage.

An operation of the power supply device 1 when an instantaneous power failure occurs is described with reference to FIG. 6. (a) in FIG. 6 illustrates an operating state or a shutdown state of the DC load 3. (b) in FIG. 6 illustrates an on-state or an off-state of the switching element 22. (c) in FIG. 6 illustrates a waveform of an AC voltage supplied from the AC power supply 2. (d) in FIG. 6 illustrates a waveform of a smoothing capacitor voltage detected by the DC-voltage detection unit 15. (e) in FIG. 6 illustrates the switch of the switching unit 12 being open or closed. Such a case is assumed here that an instantaneous power failure occurs at t41 in FIG. 6, a protection operation by the control unit 17 is started at t42 in FIG. 6, the power failure is recovered at t43 in FIG. 6, calculation of the second protection voltage is started at t44 in FIG. 6, and a recovery operation of the DC load 3 is performed at t45 in FIG. 6. In a section where boosting is performed, the booster circuit unit 14 operates as an active converter, and the smoothing capacitor voltage increases until reaching the target boosting level on the basis of the control of the control unit 17. Due to "first protection voltage<second protection voltage", the peak value of the AC voltage of the AC power supply 2 becomes equal to or higher than the value to be boosted by the booster circuit unit 14. Therefore, the smoothing capacitor voltage matches the peak value of the AC voltage of the AC power supply 2.

As illustrated in (d) in FIG. 6, because the smoothing capacitor voltage is equal to or higher than the target boosting level, the protection setting unit 16 sets the protection voltage to the second protection voltage and does not count T_stable1.

Therefore, in the case of "second protection voltage>first protection voltage", the protection setting unit 16 sets the second protection voltage as the protection voltage without providing T_stable1. If an instantaneous power failure occurs and the smoothing capacitor voltage has fallen below the protection voltage, because the control unit 17 performs the protection operation, boosting by the booster circuit unit 14 is stopped until the AC power supply 2 recovers. Therefore, the smoothing capacitor voltage does not reach the voltage exceeding the value of √2 times the AC voltage of the AC power supply 2. The protection setting unit 16 does not change the setting of the protection voltage until the AC power supply 2 recovers.

When the AC power supply 2 recovers from the instantaneous power failure, the protection setting unit 16 performs the same processing as that at the time of stopping boosting performed by the booster circuit unit 14. That is, when detecting recovery from the power failure by the AC voltage detected by the AC-voltage detection unit 19, the protection setting unit 16 holds the setting of the protection voltage and inhibits the change of the setting until T_stable2 has passed and changes the setting of the protection voltage after T_stable2 has passed. Specifically, after T_stable2 has passed, the protection setting unit 16 calculates the second protection voltage according to the equation (1) described above on the basis of the AC voltage detected by the AC-voltage detection unit 19, and changes the setting of the protection voltage to the calculated second protection voltage.

An explanation will be given of boosting and stop of boosting performed by the booster circuit unit 14 in a period during which an instantaneous power failure does not occur with reference to FIG. 7. (a) in FIG. 7 illustrates an operating state or a shutdown state of the DC load 3. (b) in FIG. 7 illustrates an on-state or an off-state of the switching element 22. (c) in FIG. 7 illustrates a waveform of an AC voltage supplied from the AC power supply 2. (d) in FIG. 7 illustrates a waveform of a smoothing capacitor voltage detected by the DC-voltage detection unit 15. (e) in FIG. 7 illustrates the switch of the switching unit 12 being open or closed. Such a case is assumed here that boosting by the booster circuit unit 14 stops at t51 in FIG. 7. In a case of "currently set protection voltage≤first protection voltage", the protection setting unit 16 sets the first protection voltage as the protection voltage after T_stable1 has passed. Further, in a case of "currently set protection voltage>first protection voltage", the protection setting unit 16 does not count T_stable1, i.e., does not set T_stable1, and sets the second protection voltage as the protection voltage.

When boosting is being performed by the booster circuit unit 14, the protection setting unit 16 maintains the set protection voltage and causes the booster circuit unit 14 to continue the boosting. If boosting by the booster circuit unit 14 is stopped according to control by the control unit 17, the protection setting unit 16 changes the currently set protection voltage to the second protection voltage. In a period during which an instantaneous power failure does not occur, the protection setting unit 16 calculates the second protection voltage on the basis of the AC voltage detected by the AC-voltage detection unit 19, and changes the setting of the protection voltage without counting T_stable2.

When boosting by the booster circuit unit 14 has stopped, the smoothing capacitor voltage does not reach the voltage exceeding the value of √2 times the AC voltage of the AC power supply 2. Further, when the first protection voltage is set as the protection voltage, even if setting is immediately changed from the first protection voltage to the second protection voltage, the voltage state becomes "smoothing capacitor voltage>protection voltage", and when the second protection voltage is set as the protection voltage, the protection voltage remains as the second protection voltage and thus the voltage state becomes "smoothing capacitor voltage>protection voltage". Therefore, the control unit 17 does not cause the switching unit 12 to open the switch. Further, the control unit 17 does not need to reduce the boosting level of the booster circuit unit 14 in a stepwise manner to stop boosting, and can immediately stop boosting performed by the booster circuit unit 14.

Therefore, the power supply device 1 can set the second protection voltage such that it falls within the ΔVrush, which is the limit value with respect to an inrush current of a semiconductor element constituting the booster circuit unit 14, without being affected by an operating state of the booster circuit unit 14 and fluctuations in the AC voltage. When the AC power supply 2 is recovered from an instantaneous power failure, the switch of the switching unit 12 has been opened to suppress the inrush current by the resistor 11, thereby enabling the inrush current at the time of recovery from the power failure to be suppressed. The power supply device 1 sets the first protection voltage or the second protection voltage as the protection voltage on the basis of boosting or stop of boosting performed by the booster circuit unit 14. Therefore, when boosting by the booster circuit unit 14 needs to be stopped, the boosting level of the booster circuit unit 14 does not need to be reduced in a stepwise manner to be stopped, and boosting by the booster circuit unit 14 can be stopped immediately. Accordingly, a switching loss generated due to an on-state of the switching element 22 of the booster circuit unit 14 can be reduced, thereby enabling energy saving to be achieved. Further, in the power supply device 1, the semiconductor elements constituting the booster circuit unit 14 can be downsized by suppressing the inrush current at the time of recovery from the power failure, thereby enabling the cost to be reduced. Further, in the power supply device 1, when the semiconductor elements constituting the booster circuit unit 14 are configured from expensive wide bandgap semiconductors such as SiC, GaN, or diamond, cost reduction can be realized by downsizing the semiconductor elements.

The operation control unit 18 constituted by the protection setting unit 16 and the control unit 17 can be configured, as illustrated in FIG. 8, from a CPU 101 that performs computing, a ROM 102 that stores therein a program read by the CPU 101, a RAM 103 into which the program stored in the ROM 102 is loaded, and an interface 104 that performs input and output of a signal. The respective constituent elements of the operation control unit 18 are programmed and stored in the ROM 102. The interface 104 receives a smoothing capacitor voltage from the DC-voltage detection unit 15 and an AC voltage from the AC-voltage detection unit 19. The interface 104 outputs a signal to cause the booster circuit unit 14 to stop or perform boosting, outputs a signal to cause the switching unit 12 to open or close the switch, and outputs a signal to stop or start operating the DC load 3.

The CPU 101 reads the program stored in the ROM 102, loads the read program into the RAM 103, calculates the first protection voltage on the basis of the boosting level of the booster circuit unit 14, and calculates the second protection voltage on the basis of the AC voltage detected by the AC-voltage detection unit 19. The CPU 101 then compares the first protection voltage with the second protection voltage, and performs computing to set either one as the protection voltage. The CPU 101 compares the smoothing capacitor voltage detected by the DC-voltage detection unit 15 with the protection voltage. If the smoothing capacitor voltage falls below the protection voltage according to the comparison result, the CPU 101 outputs a signal to cause the switching unit 12 to open the switch via the interface 104, outputs a signal to cause the booster circuit unit 14 to stop boosting, and outputs a signal to cause the DC load 3 to stop the operation.

The configuration described in the above embodiment is only an example of the content of the present invention and can be combined with other well-known techniques. A part of the configuration can be omitted or modified without departing from the scope of the invention.

The invention claimed is:

1. A power supply device comprising:
   a resistor to limit an electric current supplied from an alternating-current power supply;
   a switch that is connected in parallel with the resistor;
   a rectifier circuit that is connected to a subsequent stage of the resistor and the switch to rectify an alternating-current voltage of the alternating-current power supply;
   a booster circuit to boost a direct-current voltage rectified by the rectifier circuit;
   a direct-current-voltage detector to detect a direct-current voltage output from the booster circuit;
   an alternating-current-voltage detector to detect an alternating-current voltage of the alternating-current power supply;
   a protection setter to calculate a first protection voltage on a basis of a boosting level by the booster circuit, calculate a second protection voltage on a basis of the alternating-current voltage detected by the alternating-current-voltage detector, compare the first protection voltage with the second protection voltage, and set either one of the first protection voltage and the second protection voltage as a protection voltage; and
   a controller to open the switch when the direct-current voltage falls below the protection voltage set by the protection setter and stop boosting performed by the booster circuit, wherein
   if the direct-current voltage falls below the protection voltage immediately after supply of an alternating-current voltage from the alternating-current power supply is stopped, the protection setter holds the protection voltage without changing the protection voltage and, after supply of the alternating-current voltage from the alternating-current power supply is started and a second transition period, which is a transition period of the direct-current voltage, passes, the protection setter changes setting of the protection voltage from the first protection voltage to the second protection voltage.

2. The power supply device according to claim 1, wherein the protection setter sets the second protection voltage as the protection voltage when an operation of the booster circuit has been stopped.

3. The power supply device according to claim 1, wherein the protection setter calculates the second protection voltage such that the second protection voltage falls within a limit value with respect to an inrush current of a semiconductor element constituting the booster circuit.

4. The power supply device according to claim 1, wherein the protection setter changes setting of the protection voltage from the second protection voltage to the first protection voltage, after boosting by the booster circuit unit is started and a first transition period, which is a transition period of the direct-current voltage, passes.

5. The power supply device according to claim 1, wherein the protection setter sets the protection voltage such that the protection voltage does not fall below a set lower limit.

6. The power supply device according to claim 1, wherein a semiconductor element constituting the booster circuit is a wide bandgap semiconductor.

7. The power supply device according to claim 6, wherein the wide bandgap semiconductor is SiC, GaN, or diamond.

8. The power supply device according to claim 1, wherein the protection setter sets the second protection voltage as the protection voltage when the controller stops boosting performed by the booster circuit.

* * * * *